(12) United States Patent
Kim et al.

(10) Patent No.: US 6,794,903 B2
(45) Date of Patent: Sep. 21, 2004

(54) CMOS PARALLEL DYNAMIC LOGIC AND SPEED ENHANCED STATIC LOGIC

(75) Inventors: Chulwoo Kim, Austin, TX (US); Sung-Mo Kang, Santa Cruz, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 150 days.

(21) Appl. No.: 09/850,665

(22) Filed: May 7, 2001

(65) Prior Publication Data

US 2002/0190756 A1 Dec. 19, 2002

(51) Int. Cl.[7] ............................................. H03K 19/096
(52) U.S. Cl. ......................................... 326/98; 326/121
(58) Field of Search .............................. 326/93, 95, 96, 326/97, 98, 121

(56) References Cited

U.S. PATENT DOCUMENTS 5,612,638 A * 3/1997 Lev .............................. 326/98

OTHER PUBLICATIONS

Gin Yee and Carl Sechen, "Clock–Delayed Domino for Adder and Combinational Logic Design" in IEEE International Conference on Computer design, 1996, pp. 332–337.
Chulwoo Kim, Seong–Ook Jung, Kwang–Hyun Baek, and Sung–Mo (Steve) Kang, "Parallel Dynamic Logic (PDL) with Speed–Enhanced Skewed Static (SSS) Logic", University of Illinois at Urbana–Champaign, Department of Electrical and Computer Engineering, Coordination Science Laboratory, May, 2000.

* cited by examiner

Primary Examiner—Daniel D. Chang
(74) Attorney, Agent, or Firm—Greer, Burns & Crain, Ltd.

(57) ABSTRACT

A new CMOS dynamic logic family is based on parallel dynamic logic concept, avoiding stacked evaluation transistors. The basic configuration for the logic family is a pair of clock transistors including a NMOS and a PMOS transistor having parallel logic transistors connected between the NMOS and PMOS clock transistors. The parallel-connected transistors have gates for logic inputs and an output originating from one of a commonly connected source or drain. The family may provide NOR, NAND, OR, and AND. The family also includes BUF and INV. The BUF logic gate is realized with opposing NMOS and PMOS and an INV, while the INV uses either a single NMOS or PMOS transistor in place of the parallel-connected transistors. A speed enhanced skewed static logic gate is also provided. The speed enhanced gate uses a plurality of PMOS transistors and a plurality of NMOS transistors matched and joined as a plurality of separate gate inputs. An output from the gate is provided, and the size of PMOS and NMOS transistors are skewed. Positive feedback transistors are connected to the output. A noise suppression transistor is also connected to the output. A precharge transistor connected to the positive feedback transistors is fed from a clock signal from an associated circuit. The speed enhanced skewed state logic gate is preferably used to solve cascading problems, such as those in CD domino or the present parallel dynamic logic, and the speed enhanced static gates may be used instead of clock delay.

4 Claims, 8 Drawing Sheets

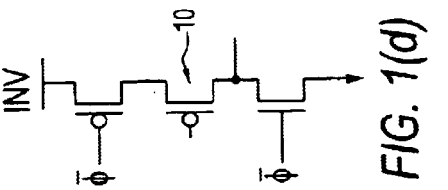
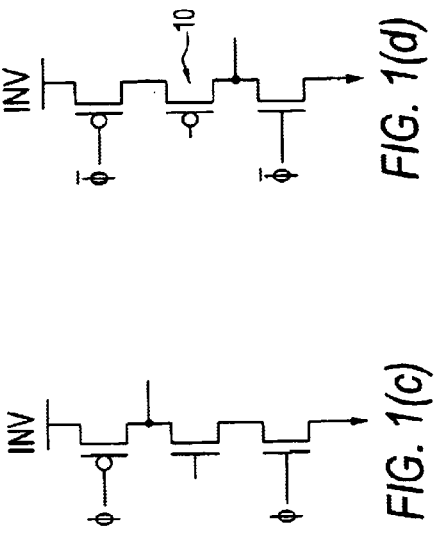
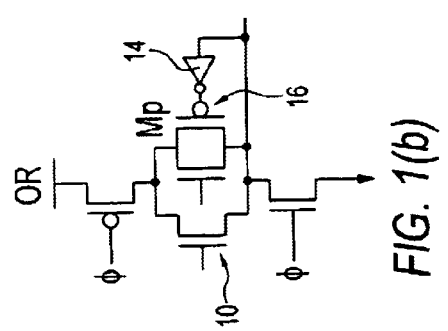
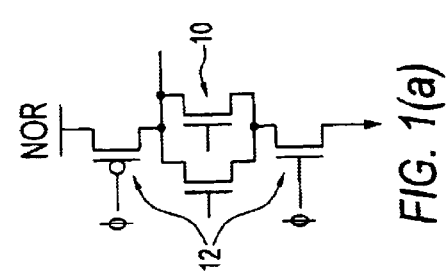
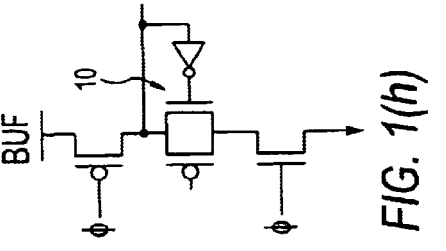
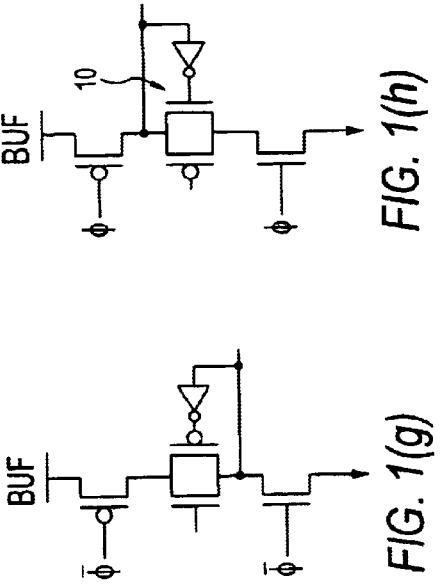
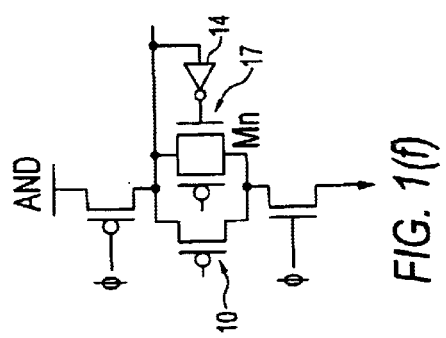
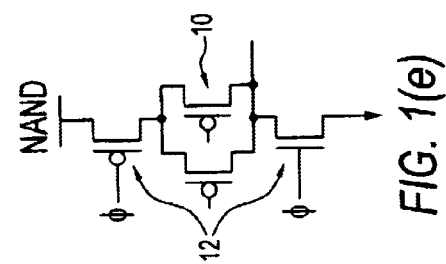

CM OS PARALLEL DYNAMIC LOGIC AND SPEED ENHANCED STATIC LOGIC

FIELD OF THE INVENTION

The field of the invention is CMOS logic. The invention finds particular use in CMOS microprocessor circuits.

BACKGROUND OF THE INVENTION

CMOS logic gates are fundamental components of microprocessor circuits. Much effort is still placed in the design of logic gate families. Static CMOS logic gates offer simple cascading, but exhibit slow response. Dynamic logic gates that have precharge and evaluation operations controlled by a clock signal often cannot be cascaded directly. A dynamic gate output precharged to a high logic level can cause improper charge operation of its next stage dynamic gate, leading to an erroneous evaluation result. If logic evaluation is through NMOS transistors of a gate, inputs for that gate should be precharged to a low logic level "L" to prevent unintended discharge. If PMOS, then precharge should be the high logic level "H" to prevent unintended charge up. If the input logic level is "X" during precharge and the output is denoted "Y", gates may only be cascaded if $Y(i)=X(j)$, where $i<j$ and $i,j$ denote the cascaded stage numbers.

Domino logic has been the logic family of choice for high-speed circuits in state-of-the-art processors such as Pentium Pro and Alpha. Domino logic circuits overcome the intrinsically slow nature of conventional static CMOS circuits, which is caused by the need for each gate to drive both NMOS and PMOS transistors. Domino logic circuits drive only NMOS transistors, thereby offering faster speed and smaller area compared to conventional static CMOS circuits.

The sole use of NMOS transistors is a drawback, however, that makes synthesis and general circuit design using a Domino logic family more complicated. Domino logic circuits have an inherently non-inverting nature, require strict timing constraints, and have a charge sharing problem. Domino logic with inverting and non-inverting outputs have been devised, but have their own set of problems.

NORA (NO RAce) circuits generate inverting logic only through strict cascading of NMOS and PMOS dynamic gates. Dual-rail logic circuits provide both inverting and non-inverting outputs, but occupy about twice the area of a standard domino gate. The extra power consumption of the dual-rail logic gates is also a serious drawback.

Some of these problems were addressed by Yee and Sechen, "Clock-Delayed Domino for Adder and Combinational Logic Design," IEEE (Pub. No. 1063-6404/96)(1996). Clock-delayed domino (CD domino) eliminates the fundamental monotonic signal requirement by propagating a clock signal with controlled delay in parallel to the logic. However, the clock delay scheme is difficult to implement in practice. The clock delay must be large enough to allow evaluation of the slowest gates. Controlling this delay while satisfying the conflicting need for high speed logic is a difficult task. The delay is set equal to the worst case pull-down delay of the corresponding dynamic gate, with an added margin for differences in signal delay, coupling parasitics, and fabrication process variations. Minimizing the set delay is thus difficult.

CD domino is also sensitive to process variations. In addition, it requires additional circuitry that takes up area and consumes power. Specifically, extra precharge transistors and a keeper are used to reduce the effects of charge sharing, noise and coupling parasitics. Each CD domino gate typically requires a clock-delay logic device.

SUMMARY OF THE INVENTION

A new CMOS dynamic logic family is provided by this invention. The family is based on a parallel dynamic logic concept, avoiding stacked evaluation transistors. The basic configuration for the logic family is a pair of clock transistors including an NMOS and a PMOS transistor and parallel logic transistors connected between the NMOS and PMOS clock transistors. The parallel-connected transistors have gates for logic inputs and an output originating from one of a commonly connected source or drain. The family can provide NOR, NAND, OR, and AND. The family may also include BUF and INV. The BUF logic gate is realized with NMOS and PMOS transistors as evaluation transistors, while the INV uses either a single NMOS or PMOS transistor in place of the parallel-connected transistors.

Potential cascading difficulties in the parallel dynamic logic are solved by a speed enhanced skewed static (SSS) logic gate that is also provided by the invention. The speed enhanced gate uses a plurality of PMOS transistors and a plurality of NMOS transistors matched and joined to form a plurality of separate gate inputs. An output from the gate is provided, and the sizes of PMOS transistors and NMOS transistors are skewed compared to conventional CMOS logic. Positive feedback transistors are connected to the output. A noise suppression transistor is also connected to the output. A precharge transistor connected to the positive feedback transistors is fed from a clock signal from an associated circuit. The speed enhanced skewed state logic gate is preferably used to solve cascading problems, as in CD domino or the present parallel dynamic logic, and the speed enhanced static gates may be used instead of clock delay. Also SSS logic can improve the speed of high fan-in gate or a gate with large output load.

BRIEF DESCRIPTION OF THE DRAWINGS

Other features, advantages and objects of the invention will be apparent to those skilled in the art with reference to the detailed description, and the drawings, of which:

FIGS. 1(a)–1(h) illustrate a preferred embodiment parallel dynamic logic family of the invention.

DETAILED DESCRIPTION OF THE PREFERRED EMBODIMENTS

Figure 2B:
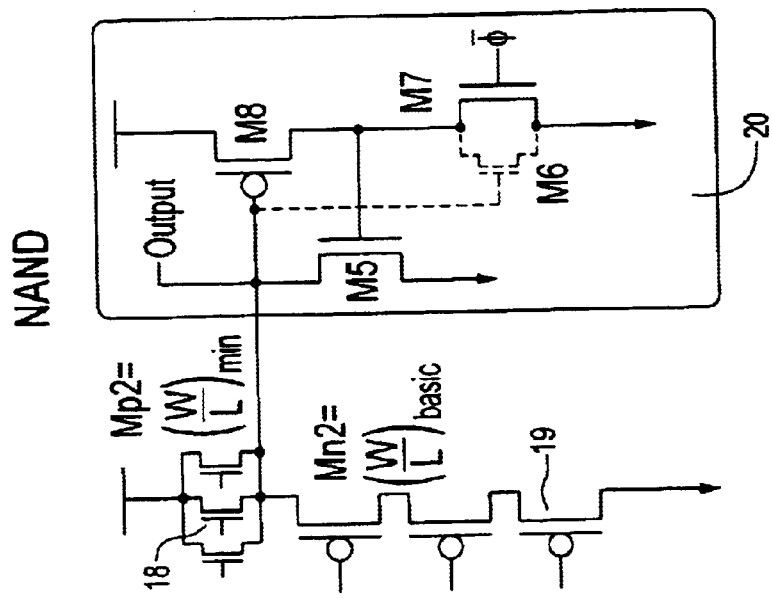
FIGS. 2(a) and 2(b) illustrate preferred embodiment speed enhanced skewed static logic gates of the invention.

A preferred family of parallel dynamic CMOS logic gates are shown in FIGS. 1(a)–1(h), with all but the INV of FIGS.

1(c) and 1(d) and the BUF of FIGS. 1(g) and 1(h) being two-input gates. The hallmark of the family is the solely parallel topology for logic evaluation transistors 10 used in the gates between clock transistors 12. Each gate includes a pair of clock transistors 12 including a NMOS and a PMOS transistor. Each gate lacks stacked logic evaluation transistors. Each gate except INV and BUF includes, connected between the NMOS and said PMOS clocking transistors, at least a pair of parallel-connected logic evaluation transistors 10. These parallel-connected logic evaluation transistors have gates for logic inputs and an output originating from one of a commonly connected source or drain.

The clock transistors 12 receive opposite polarity clock signals, i.e., clock signals that are 180° out of phase. In a family of logic gates according to the invention, each gate relies upon parallel type topology for logic evaluation transistors 10. Due to the unstacked scheme for logic evaluation, there is no charge sharing problem that is a common drawback of other dynamic logic families. The OR of FIG. 1(b) and the AND of FIG. 1(f) use a static inverter 14 and a transistor 16, Mp in FIG. 1(b) and a transistor 17, Mn in FIG. 1(f), to overcome threshold voltage drop and to aid achieving a full logic level at the output node. Further speed improvement may be obtained through use of positive feedback circuits as the inverter 14. Though the gates other than BUF and INV are shown as two input gates, the parallel-connected logic evaluation transistors 10 can be more complex gates with additional inputs provided by additional parallel-connected transistors. A comparable stacked topology takes about n times the area of a parallel topology of the invention, where n is the number of input gates.

The dynamic logic of the invention, unlike a stacked topology, permits the commencement of output evaluation to begin when any input signal arrives at the gate terminal of any one of the evaluation transistors 10. Evaluation can even be finished before the latest input signal arrives if the difference of input signal arriving time is bigger than gate delay. This is a distinct advantage in real chip implementation, where input signals typically arrive at different times. Cascading ability is also an additional advantage. In sub-1V technology, leakage current is a serious problem due to the low threshold voltage of transistors. The dynamic logic of the invention allows use of relatively high threshold voltage transistors under sub-1V operation to avoid the leakage problem even in a cascaded structure.

Dynamic logic gates may be classified according to their logic levels. If the evaluation transistors of a dynamic gate consist of only NMOS transistors, all inputs for that gate should be a low logic level "L". If only PMOS transistors, all inputs for a gate should be a high logic level "H". Using "X" as the input level variable and "Y" as the output level variable, gates may be labeled using the form "XY". "X" is related to logic level of inputs to the gate during precharge phase and "Y" is related to logic level of inputs during a precharge phase. As seen in FIG. 1, the dynamic logic family of the invention results in a "HH" type AND gate, a "LL" type OR gate, a "HL" type NAND gate and a "LH" type NOR gate. This indicates limitation in cascading gates to avoid an output related to the precharge state instead of the input logic levels. Clock delay may be invoked to avoid this problem, as in CD domino, but this leads to complications discussed in the background of this application. A preferred alternative to clock delay is the speed enhanced skewed state logic of FIGS. 2(a) and 2(b).

Figure 2A:
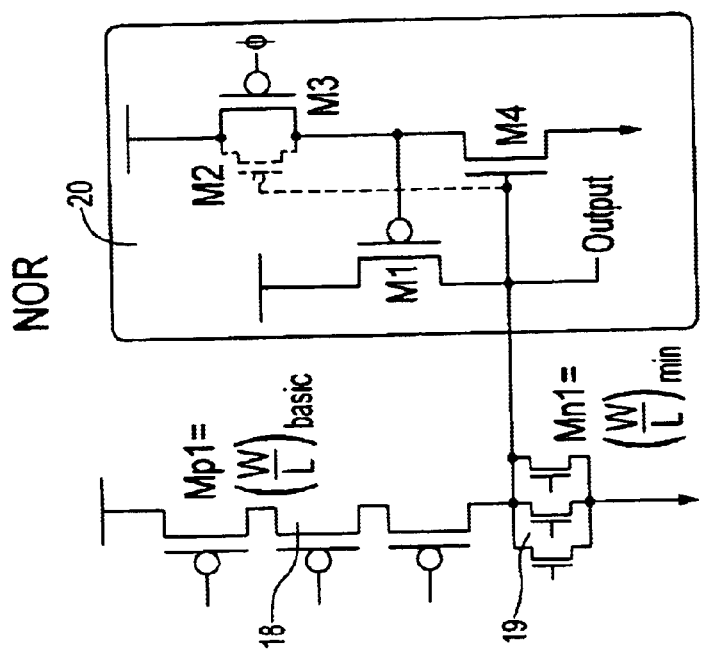

Skewed state logic uses smaller size transistors, and imposes smaller input capacitance. Another aspect of the invention provides a speed enhancement for static skewed state logic gates as illustrated in FIGS. 2(a) and 2(b). Stacked transistors 18 with inputs fanned out to parallel-connected transistors 19 form skewed static logic gates. A NOR gate is shown in FIG. 2(a) and a NAND gate in FIG. 2(b), with a modification of the invention to add accelerators 20. In the NOR gate the NMOS transistors are smaller than the PMOS transistors, while in the NAND gate the NMOS transistors are bigger than the PMOS transistors. Apart from the accelerator 20, the NOR and NAND gates are conventional skewed CMOS static circuits having a trip point deviated from Vdd/2 for fast transition, accomplished with the Mn1 and Mp2 transistors being smaller than respective Mp1 and Mn2 transistors. Though two inputs are shown, the number of inputs may range from two to eight. The plurality of Mp PMOS transistors in each case are matched and joined with a plurality of the Mn NMOS transistors as a plurality of separate gate inputs with the PMOS transistors being larger than the NMOS transistors in the case of the NOR gate and the opposite being true in the case of the NAND gate. The output is taken from the smaller parallel-connected transistors in each gate. The accelerators 20 enhance output speed through positive feedback on the output. In FIGS. 2(a) and 2(b), transistors M1 M4, M5 and M8 connected to the outputs provide positive feedback assisted by precharge transistors M3 and M7 (also connected to the outputs) that are fed from a clock signal from related circuitry. Transistors M2 and M6 act to suppress noise and ensure stable operation by preventing the gate output from floating. The positive feedback M1 M4, M5 and M8 transistors form respective loops connected to the outputs and the respective precharge transistors M3 and M7 are connected to the loop.

Figure 3A:
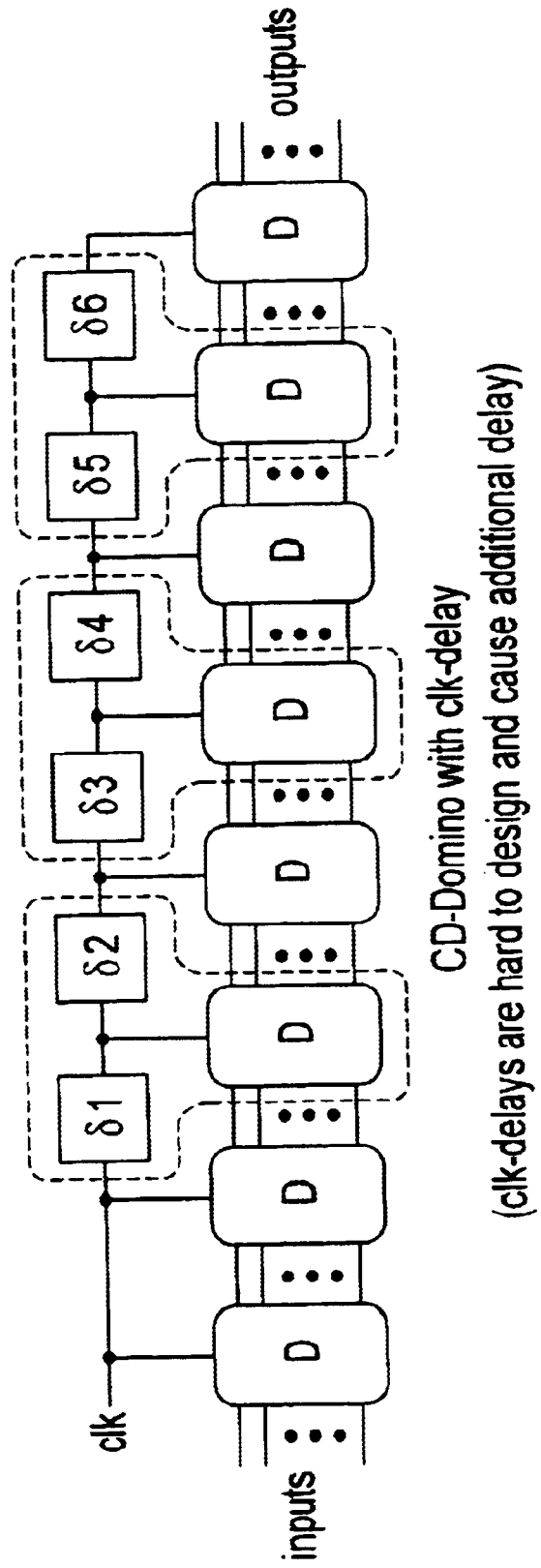
FIG. 3(a) illustrates cascading of conventional CD domino.
Figure 3B:
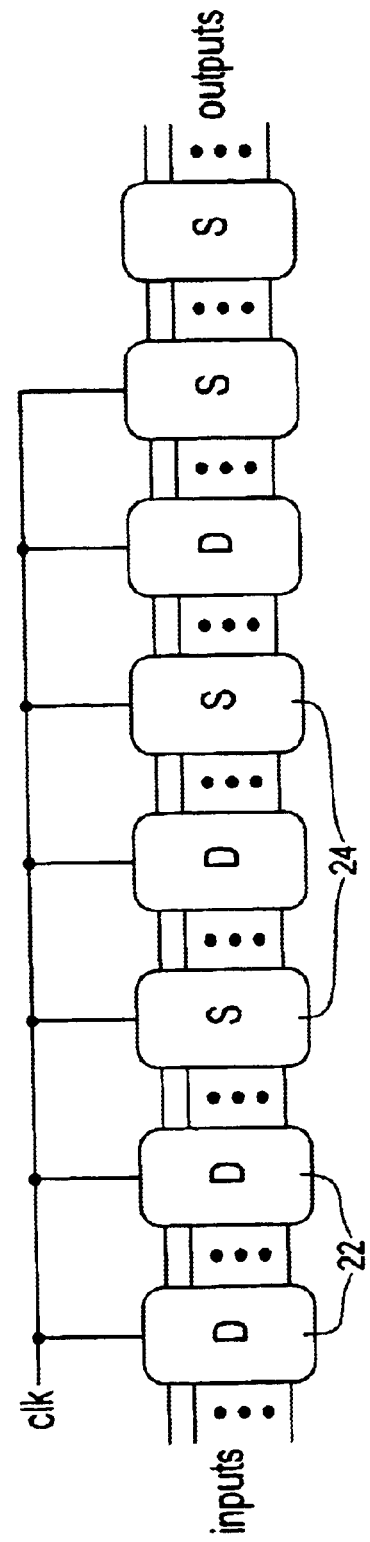
FIG. 3(b) illustrates cascading of the parallel dynamic logic and the speed enhanced skewed state logic of the invention.

The skewed logic gates of FIGS. 2(a) and 2(b) may be advantageously combined to avoid the need for clock delay circuits when used with the dynamic logic family of FIGS. 1(a)–1(g). A skewed logic gate of FIGS. 2(a) and 2(b) is added wherever a cascading problem arises, instead of employing a clock delay scheme at that gate. An exemplary comparison is shown in FIGS. 3(a) and 3(b), with 3(a) showing clock delay necessary to avoid errors in CD domino or the parallel dynamic logic of FIGS. 1(a)–1(g). In FIG. 3(b) parallel dynamic logic gates 22 are in a cascaded arrangement with speed enhanced skewed static logic gates 24. The speed enhanced skewed logic gates 24 are placed where necessary in the cascaded arrangement to avoid a connection between a parallel dynamic logic gate output precharged to a first type and a parallel dynamic logic gate precharged to a second type. The speed enhanced skewed logic gates 24 may also be placed where necessary in a CD-domino cascaded arrangement to avoid a connection between a CD-domino logic gate output precharged to a first type and a domino logic gate precharged to a second type.

Figure 4A:
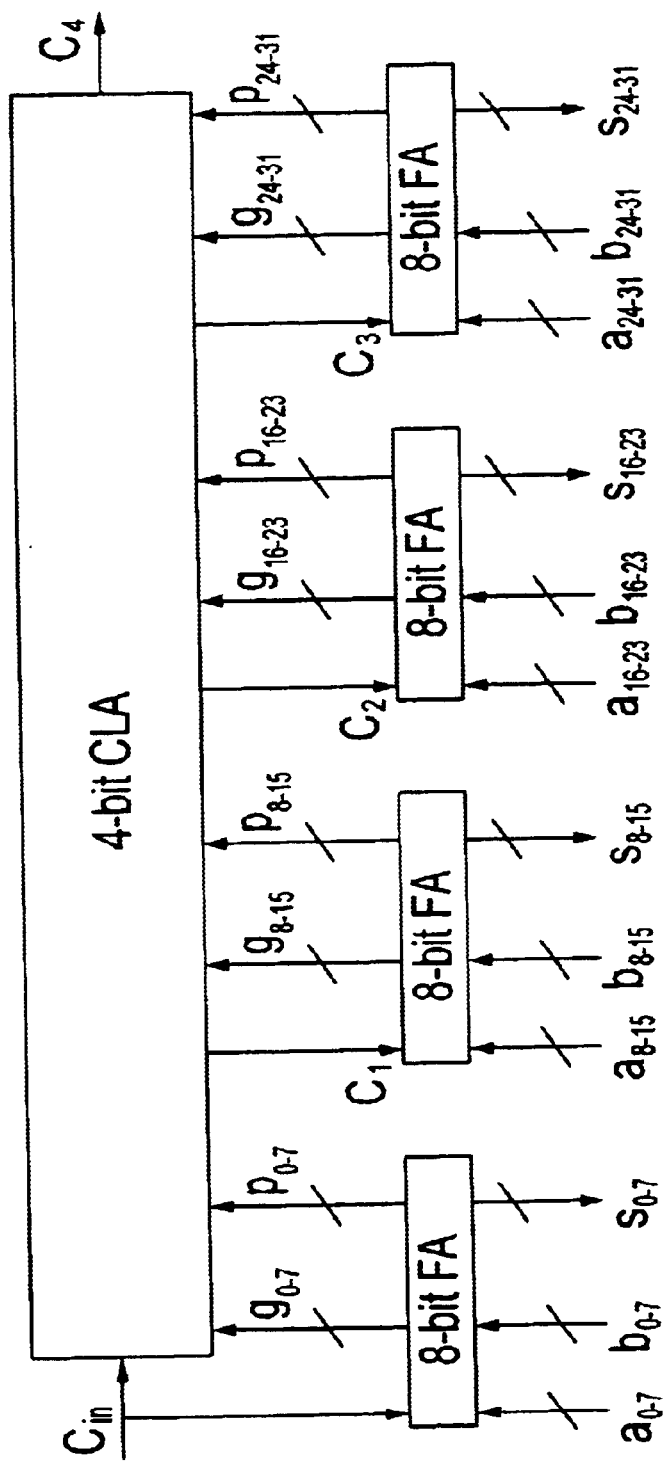
FIG. 4(a) illustrates a 32 bit carry look ahead adder.
Figure 4B:
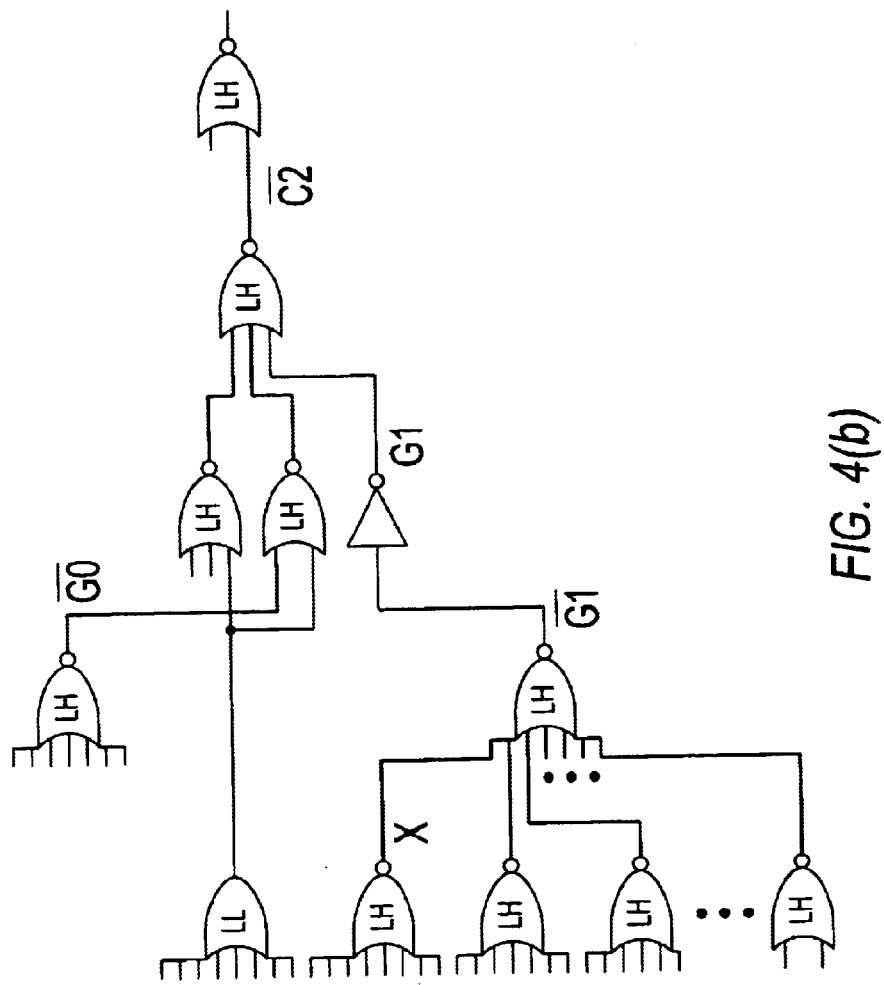
FIG. 4(b) illustrates a CD-domino implementation of the FIG. 4(a) adder.
Figure 4C:
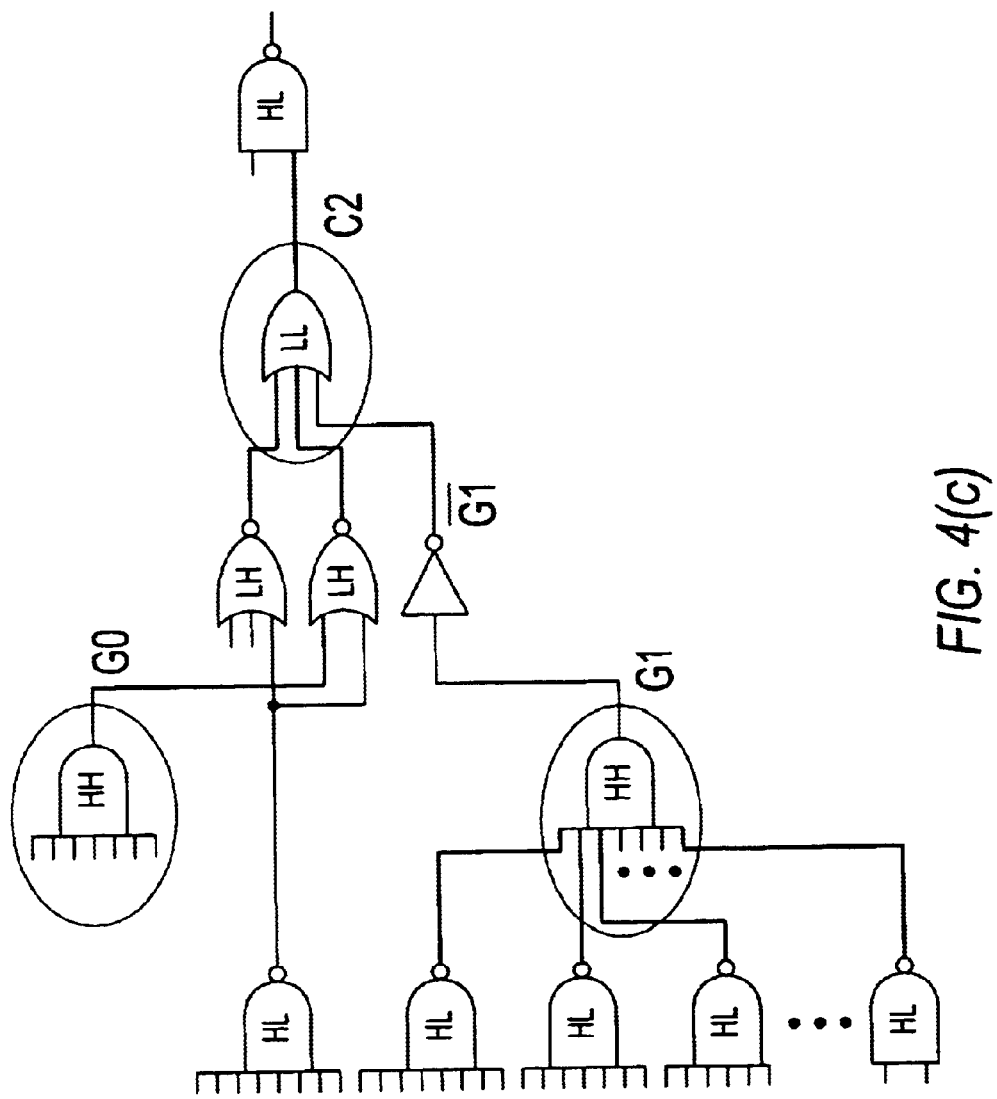
FIG. 4(c) illustrates a parallel dynamic logic implementation of the FIG. 4(a) adder.
Figure 4D:
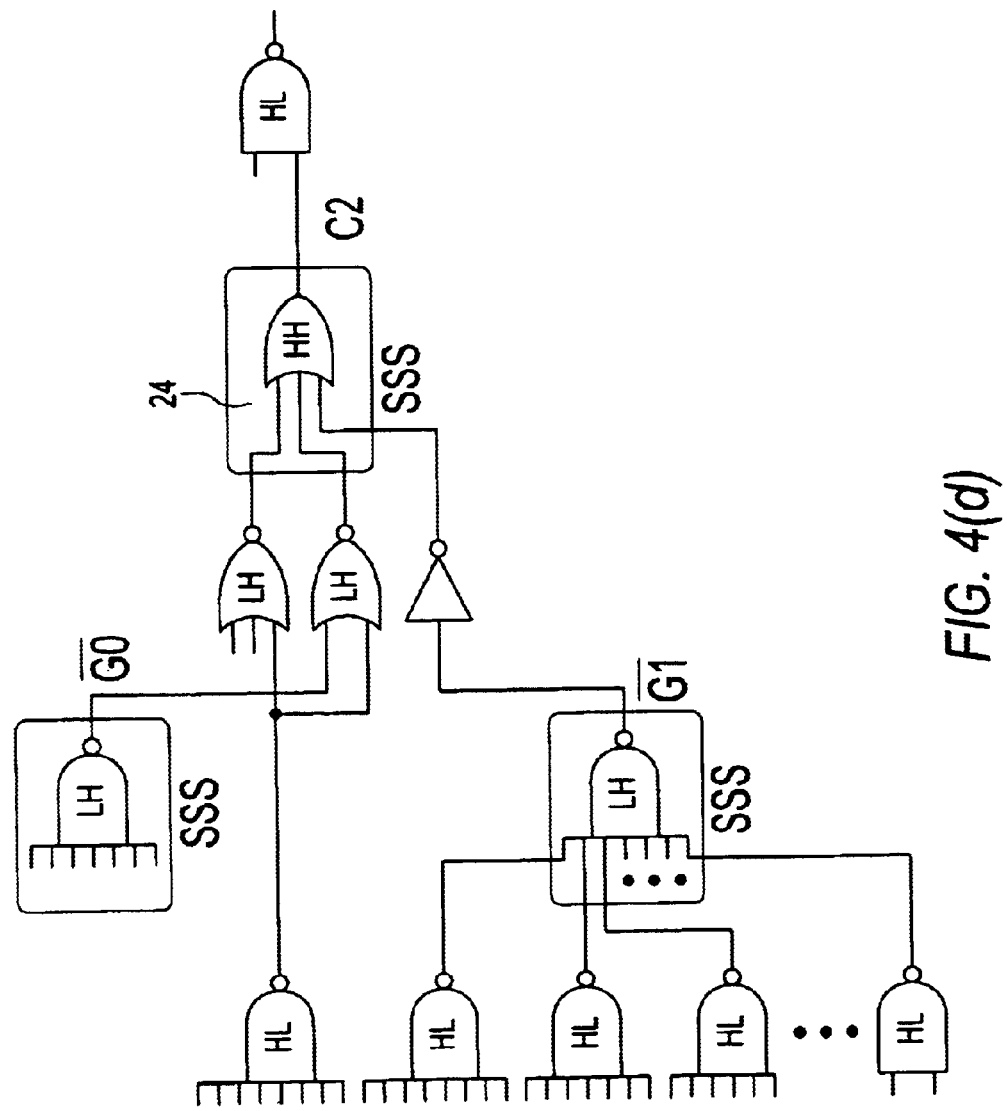
FIG. 4(d) illustrates a parallel dynamic logic with speed enhanced skewed state logic implementation of the FIG. 4(a) adders.

FIG. 4(a) shows a 32 bit carry look ahead adder. FIGS. 4(b)–4(d) compare implementations of the FIG. 4(a) adder using PDL (FIG. 4(c)) and CD domino (FIG. 4(b)). Both the PDL and the CD domino implementations would require clock delay. Bold lines in FIGS. 4(b) and 4(c) indicate where direct cascading is not possible and clock delay would be required. The use of the skewed state logic, however, eliminates the cascading problem, as shown in FIG. 4(d). There, skewed state logic gates 24 solve the cascade problem. As a result, the longest path of a 32 bit adder reduces from 12 simple gates (as for conventional domino) to 8 simple gates without clock delay. The adder follows the ideal set forth in FIG. 3(b), with the speed enhanced skewed state logic gates avoiding the need for clock delay elements.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A CMOS speed-enhanced skewed static logic gate, comprising:
   a plurality of PMOS transistors and a plurality of NMOS transistors matched and joined as a plurality of separate gate inputs and including an output, the PMOS transistors being larger than the NMOS transistors for NOR gate and the NMOS transistors being larger than the PMOS transistors for NAND gate;
   positive feedback transistors connected to and providing positive feedback on the output;
   a noise suppression transistor connected to the output; and
   a precharge transistor connected to the positive feedback transistors, the precharge transistor being fed from a clock signal from an associated circuit.

2. The CMOS speed-enhanced skewed static logic gate of claim 1, wherein said positive feedback transistors comprise a loop connected to the output and said precharge transistor is connected to said loop.

3. A CMOS cascaded circuit, the circuit comprising:
   parallel dynamic logic gates in a cascaded arrangement with speed enhanced skewed static logic gates, wherein one of the speed enhanced skewed static logic gates is placed in the cascaded arrangement to avoid a connection between a first CD-domino logic gate output precharged to a first type and a second CD-domino logic gate output precharged to a second type; wherein
   each of said parallel dynamic logic gates are formed from a parallel dynamic logic family based upon a logic configuration comprising a pair of clock transistors including a NMOS and a PMOS transistor; and, connected between said NMOS and said PMOS transistor, at least two parallel connected transistors having gates for dynamic logic inputs and a dynamic logic output originating from one of a commonly connected source or drain; and each of said speed enhanced skewed static logic gates comprise a plurality of PMOS transistors and a plurality of NMOS transistors matched and joined as a plurality of separate static gate inputs and including a static gate output, the PMOS transistors of said plurality of PMOS transistors being sized differently than the NMOS of said plurality of NMOS transistors;

positive feedback transistors connected to the static gate output;

a noise suppression transistor connected to the static gate output; and a precharge transistor connected to the positive feedback transistors, the precharge transistor being fed from a clock signal from an associated circuit.

4. A CMOS cascaded circuit, the circuit comprising:

parallel dynamic logic gates in a cascaded arrangement with speed enhanced skewed static logic gates, wherein one of the speed enhanced skewed static logic gates placed in the cascaded arrangement to avoid a connection between a first dynamic logic gate output precharged to a first type and a second dynamic logic gate output precharged to a second type; wherein each of said speed enhanced skewed static logic gates comprise a plurality of PMOS transistors and a plurality of NMOS transistors matched and joined as a plurality of separate static gate inputs and including a static gate output, the PMOS transistors of said plurality of PMOS transistors being sized differently than the NMOS of said plurality of NMOS transistors;

positive feedback transistors connected to the static gate output;

a noise suppression transistor connected to the static gate output; and a precharge transistor connected to the positive feedback transistors, the precharge transistor being fed from a clock signal from an associated circuit.

* * * * *